United States Patent
Block et al.

(10) Patent No.: US 7,454,178 B2
(45) Date of Patent: Nov. 18, 2008

(54) LOW-LOSS TRANSMITTER MODULE

(75) Inventors: Christian Block, Stainz (AT); Holger Flühr, Graz (AT); Christian Hoffmann, Deutschlandsberg (AT)

(73) Assignee: EPCOS AG (DE)

( * ) Notice: Subject to any disclaimer, the term of this patent is extended or adjusted under 35 U.S.C. 154(b) by 494 days.

(21) Appl. No.: 11/272,596

(22) Filed: Nov. 14, 2005

(65) Prior Publication Data

US 2006/0121874 A1 Jun. 8, 2006

Related U.S. Application Data

(63) Continuation of application No. PCT/EP2004/004078, filed on Apr. 16, 2004.

(30) Foreign Application Priority Data

May 12, 2003 (DE) ............................... 103 21 247

(51) Int. Cl.
*H04B 1/02* (2006.01)
(52) U.S. Cl. ..................... 455/91; 455/114.2; 375/297
(58) Field of Classification Search ............... 455/91, 455/95, 114.1, 114.2, 115.1, 127.1, 127.2, 455/333, 552.1, 553.1; 375/295, 297
See application file for complete search history.

(56) References Cited

U.S. PATENT DOCUMENTS 4,130,731 A * 12/1978 Bolgiano et al. ............ 455/403

| | | | |
|---|---|---|---|
| 6,400,963 B1 * | 6/2002 | Glockler et al. | 455/553.1 |
| 6,462,628 B2 | 10/2002 | Kondo et al. | |
| 6,625,470 B1 * | 9/2003 | Fourtet et al. | 455/127.4 |
| 6,833,771 B1 | 12/2004 | Ohta et al. | |
| 2003/0032396 A1 | 2/2003 | Tsuchiya et al. | |
| 2004/0005913 A1 | 1/2004 | Bollenbeck | |

FOREIGN PATENT DOCUMENTS

| | | |
|---|---|---|
| DE | 10102201 A1 | 1/2001 |
| DE | 10102891 A1 | 11/2001 |
| DE | 10052711 A1 | 5/2002 |
| EP | 1233528 A1 | 8/2002 |

* cited by examiner

*Primary Examiner*—Quochien B Vuong
(74) *Attorney, Agent, or Firm*—Mayback & Hoffman, P.A.; Gregory L. Maybeck; Scott D. Smiley

(57) ABSTRACT

A transmitter module of a wireless transmission system with at least one transmission path having a power amplifier disposed at the input side includes a low-pass filter disposed at the output side and an impedance converter disposed therebetween. The power amplifier and the low-pass filter are, thereby, disposed on the top surface of a multi-layer carrier substrate. Preferably, the impedance converter is disposed in metallization planes of the carrier substrate. The inventive integration of all of these components in one module especially allows for a step-wise impedance adaptation between the low-impedance amplifier output and the output of the transmitter module having a defined output impedance (e.g. 50 ohm), whereby the impedance adaptation is partially carried out by the low-pass filter. A multistage impedance adaptation allows for a reduction of, e.g., the length of the line sections used in the impedance converter and the signal losses involved.

34 Claims, 4 Drawing Sheets

LOW-LOSS TRANSMITTER MODULE

CROSS-REFERENCE TO RELATED APPLICATION

This is a continuing application, under 35 U.S.C. §120, of copending international application No. PCT/EP2004/004078, filed Apr. 16, 2004, which designated the United States; this application also claims the priority, under 35 U.S.C. §119, of German patent application No. 103 21 247.7, filed May 12, 2003; the prior applications are herewith incorporated by reference in their entirety.

BACKGROUND OF THE INVENTION

Field of the Invention

The present invention relates to a transmitter module, particularly, a transmitter module for end devices of mobile telecommunication.

Mobile radio devices operate one or several mobile radio systems that use one or several frequency bands (or mobile radio standards). The signal transmission takes place in a frequency band that is associated with a mobile radio standard and that includes a range of transmission and a range of reception.

The transmission chain of a mobile radio device commonly includes a chip set, a power amplifier, a coupler for controlling the power, an antenna switch, and/or a passive frequency switch and an antenna.

A chip set is one or several integrated circuits connected together (HF-IC, High Frequency Integrated Circuits) that generate a carrier signal and mix this signal with an intelligence signal.

A power amplifier commonly has at least two stages that include a voltage amplifier and a current amplifier.

A passive frequency switch can be a diplexer for separating the signals of different frequency bands or a duplexer for separating the transmission and receiving signals of a frequency band.

A coupler is switched in the control circuit of the power amplifier and regulates the power strength of the power amplifier.

It is known to embody the above functional blocks as individual elements with adaptation networks located therebetween for impedance adaptation. Such a circuit has a disadvantage in that, due to the many interfaces, a corresponding number of signal losses occur.

It is also known that a power amplifier, a coupler, and an adaptation network can be integrated in a component. This solution has a disadvantage in that adaptation elements are necessary on a printed circuit of a mobile radio at the interface to the low-pass filter for equalizing the phase rotation of the signal by the connection line. These adaptation elements aid in increasing the insertion attenuation of the circuit.

SUMMARY OF THE INVENTION

It is accordingly an object of the invention to provide a low-loss transmitter module that overcomes the hereinaforementioned disadvantages of the heretofore-known devices of this general type.

With the foregoing and other objects in view, there is provided, in accordance with the invention, a transmitter module for a high-frequency stage of a wireless communication system having an input impedance $Z_i$ and an output impedance $Z_o$, the system having a signal path embodied as transmission path having an input side and an output side, the signal path being disposed between a signal input and a signal output to be connected to an antenna, the transmitter module includes a carrier substrate having a top surface, metallization planes, dielectric layers between the metallization planes, and through contacts connecting ones of the metallization planes, a power amplifier being disposed on the top surface of the carrier substrate and in the signal path on the input side thereof, the power amplifier having an output impedance $Z_{PA} < Z_i$, a low-pass filter disposed in the signal path at the output side, the low-pass filter having an input impedance $Z_{LPi}$ and an output impedance $Z_{LPo}$, the output impedance $Z_{PA}$ of the power amplifier being $Z_{PA} < Z_{LPi} < Z_o$ and the input impedance $Z_{LPi}$ of the low-pass filter being $Z_{LPi} < Z_{LPo} \leqq Z_o$, an impedance converter carrying out an impedance transformation from $Z_{PA}$ to $Z_{LPi}$ and being disposed in the signal path between the power amplifier and the low-pass filter, and at least one of the impedance converter and the low-pass filter having passive components at least partially embodied as at least one of conductor track sections in at least one of the metallization planes and conductor track sections and layer regions of the dielectric layer disposed between the conductor track sections.

The invention pertains to a transmitter module for the high-frequency stage of a wireless communication system. The transmitter module has an input impedance $Z_{01}$ and an output impedance $Z_{02}$. The transmitter module has a signal path embodied as a transmission path, which is disposed between a signal input and a signal output that can be connected with an antenna. The transmission module includes a power amplifier disposed in the signal path at the input side, whose output impedance $Z_{PA}$ is smaller than $Z_{01}$, a low-pass filter disposed at the output side in the signal path, whose input impedance is $Z'_{01}$ and whose output impedance is $Z'_{02}$, whereby the input impedance $Z'_{01}$ is greater than $Z_{PA}$ and smaller than $Z_{02}$. The output impedance $Z'_{02}$ has the ratio $Z'_{01} < Z'_{02} \leqq Z_{02}$. An impedance converter, which carries out an impedance transformation from $Z_{PA}$ to $Z'_{01}$ is disposed in the signal path between the power amplifier and the low-pass filter. The power amplifier is disposed on the top surface of a carrier substrate. On its top side, bottom side, and between dielectric layers, the carrier substrate has metallization planes, whereby the metallization planes are connected by through-contacts. The impedance converter and/or the low-pass filter each have passive components, which are at least partly embodied as conductor track sections in at least one of the metallization planes and/or through conductor track sections and layer regions of the dielectric layer disposed therebetween.

$Z_{01}$ and $Z_{02}$ can be standard impedances, for example, 50 Ohm, whereby, preferably, $Z_{01} = Z_{02}$.

In a preferred embodiment of the invention, at least a portion of the passive components is realized as conductor track sections in at least one of the metallization planes located on the inside or by conductor track sections hidden on the inside of the carrier substrate and layer regions of the dielectric layer located therebetween. Preferably, all of the passive components of the impedance converter and of the low-pass filter are hidden completely in the inside of the substrate. However, it is also possible that a portion of the passive components is chosen from discrete components, such as, for example, a chip capacitor or a coil, disposed, for example, on the top side of the carrier substrate, and electrically connected, for example, by through-contacts, with the passive components of the same circuit (low-pass), embodied or hidden in the carrier substrate.

In accordance with another feature of the invention, a passive component of the low-pass filter according to the invention is a concentrated circuit element, particularly, an inductor or a capacitor.

In accordance with a further feature of the invention, a passive component of the impedance converter is an inductor, a capacitor, or a line section.

Herein, an impedance transformation (contrary to an impedance adaptation) is a change from an impedance $Z_1$ to an impedance $Z_2$, whereby $Z_1$ and $Z_2$ differ by at least a factor of two.

An impedance converter carries out an impedance transformation from an impedance $Z_1$ (input impedance of the impedance converter, here $Z_1=Z_{PA}$) to $Z_2$ (output impedance of the impedance converter, here $Z_2=Z'_{01}$), i.e., in the configuration according to the invention, the adaptation of the output impedance of the amplifier to the input impedance of the low-pass filter.

An impedance converter can include, for example, a line section, the length of which corresponds to the required phase rotation of the signal in the Smith Diagram (for example by 180°). The phase rotation of the signal by 180° corresponds to a λ/4-line, whereby λ is a wavelength corresponding to the signal frequency (here, transmitter frequency). By a λ/4-line, a short-circuit at one end is converted into an open end at the opposite end of the λ/4-line. It is, thus, possible to protect the output of the power amplifier against a short-circuit at the antenna side by an impedance converter embodied as λ/4-line and disposed between the output of the power amplifier and the antenna.

It is also possible that the impedance converter has a plurality of stages and is embodied, for example, by line sections and/or inductors disposed in the signal path and capacitors connected thereto in parallel, which corresponds to members of a low-pass filter of the n-th order ($n \geq 1$) connected behind each other.

In the high-frequency ranges, the impedance transformation from $Z_1$ to $Z_2$ can be carried out precisely only at a frequency of $f_0$ because, in this frequency range, $Z_1$ and $Z_2$ generally are frequency-dependent. At frequencies deviating from $f_0$, the output of the impedance converter is, thus, fault-adapted. This results in a band-pass behavior of the impedance converter, the bandwidth of which is the frequency difference of two frequencies, where the signal decreases, for example, by 3 dB from the maximum value achievable from $f_0$. A small bandwidth of the impedance converter, in comparison to the bandwidth of the modulated signals (which is typically a few up to hundreds of kHz), can, thus, influence or distort the signal, which leads to signal losses.

The absolute fault adaptation of the output impedance $Z_2$ decreases in accordance with a lower transformation ratio $Z_2/Z_1$ or the signal transmission through the impedance converter becomes more broad-banded. Simultaneously, the impedance $Z_L$ of the line decreases, $Z_L=\sqrt{Z_1 Z_2}$, which ensures a lower insertion attenuation during signal transmission through the line.

The idea on which this invention is based, which is to carry out the impedance transformation from the output impedance $Z_{PA}$ of the power amplifier to the input impedance of the antenna in a plurality of stages, rests on this consideration. Such an impedance transformation is possible by the integration of a power amplifier and a low-pass filter in a transmitter module, as shown in the present invention, and has the advantage that the impedance transformation from the output impedance $Z_{PA}$ of the power amplifier to the input impedance of the antenna, on one hand, is partly (for example, from 2 to 20 Ohm) taken over by the impedance converter and, on the other hand, partly (for example, from 20 to 50 Ohm) by the low-pass filter or by the low-pass filter and the stages connected at the output side, for example, the antenna switch. The amount of fault adaptations to respective interfaces is thereby lower and the transmission behavior of the corresponding circuit section is more broad-banded.

Due to the fact that, according to the invention, the power amplifier and the low-pass filter are realized in a module, the interfaces therebetween, which are to be adapted later, are negligible, which reduces the signal losses in intermediate stages.

In accordance with an added feature of the invention, an antenna switch and/or a passive frequency switch are disposed in the signal path between the low-pass filter and the signal output. Preferably, the antenna switch is connected between the low-pass filter and the passive frequency switch. Alternatively, the passive frequency switch can be connected between the low-pass filter and the antenna switch. The passive frequency switch can be embodied as a diplexer or as a duplexer.

In accordance with an additional feature of the invention, an adaptation network can be connected in the signal path between the signal input and the power amplifier. The adaptation network can be disposed in at least one metallization plane.

In accordance with yet another feature of the invention, a coupler can be provided, which is partly disposed in the module and which is in a circuit that is separated galvanically from the signal path of the module. The coupler, particularly, a directional coupler, serves, for example, for monitoring the transmission power of the amplifier.

For example, a coupler can include two capacitively coupled line sections (referred to as strappings or coupling lines). Alternatively, a coupler can also be embodied as a transformation circuit of two inductivities. One of the coupling inductivities or coupling lines (first coupling element) is thereby disposed in the signal path downstream of the power amplifier. Preferably, the other coupling inductor or coupling line (second coupling element), coupled therewith, is connected in series with a power detector (for example, a diode) in the control circuit of the power amplifier. This power detector can be disposed in the chip set or in the transmitter module.

In accordance with yet a further feature of the invention, the first and the second coupling inductor or coupling lines can be embodied next to each other in the same metallization plane or on top of each other in at least two adjacent metallization planes. The first coupling element can be disposed in the low-pass filter or in the impedance converter. A further possibility lies in disposing the first coupling element between the impedance converter and the low-pass filter. The first coupling element can also be connected at the output side of the low-pass filter. In an embodiment of the coupling element as a coupling line, the second coupling line can have the same length as or be shorter than the first coupling line. Preferably, the first coupling line is embodied as a λ/4-line.

In accordance with yet an added feature of the invention, the coupler has first and second coupling inductors, a first of the coupling inductors is disposed in the signal path downstream of the power amplifier, and the first and second coupling inductors are coupled through a transformer coupling.

In accordance with yet an additional feature of the invention, the coupler has a first coupling line having a given length and being disposed in the signal path downstream of the power amplifier with respect to a direction from the input side to the output side, a second coupling line having a length no greater than the given length, the first and second coupling lines being coupled through a capacitive coupling, and the first and second coupling lines being one of disposed next to one another in the same one of the metallization planes and disposed on top of one another in at least two adjacent ones of the metallization planes.

In accordance with again another feature of the invention, the first coupling line is disposed in one of the low-pass filter and the impedance converter.

In accordance with again a further feature of the invention, the coupling is disposed one of upstream of and downstream from the low-pass filter.

In accordance with again an added feature of the invention, at least one of the impedance converter and the low-pass filter has at least one stage, the at least one stage being one of a power transformation, a low pass filter member, a line section and a capacitor connected in parallel thereto against ground, and a combination of LC elements.

In accordance with again an additional feature of the invention, the impedance converter carries out a 180-degree phase rotation of the signal at a given transmission frequency.

In accordance with still another feature of the invention, the impedance converter and/or the low-pass filter can have one or a plurality of stages. At least one of the stages can be realized by a line section or a low-pass filter member. Alternatively, the corresponding stage can be realized by a line section and a capacitor connected in parallel therewith against ground or by a random combination of LC-elements.

In accordance with still a further feature of the invention, at least one further signal path connected with a second signal input embodied as transmission path can be disposed, which is connected with the signal output through the said or a further antenna switch or through a passive frequency switch and that substantially has the same components as the first signal path. The first and the second signal path can each be associated with different frequency bands of wireless communication systems.

In accordance with still an added feature of the invention, the dielectric layers of the carrier substrate are, preferably, made from ceramic. Alternatively, the carrier substrate can have a mixed construction of ceramic and laminate layers (for example, FR4, BT, ALIVH).

In accordance with still an additional feature of the invention, at least one of the dielectric layers has a dielectric constant>12.

In accordance with another feature of the invention, there are provided at least one receiving path, a front end partial module disposed in the at least one receiving path, and the front end partial module is associated with the carrier substrate.

In accordance with a further feature of the invention, the carrier substrate has a surface and the front end partial module is disposed on the surface of the carrier substrate.

In accordance with an added feature of the invention, the front end partial module has at least one band-pass filter operating with acoustic waves.

In accordance with an additional feature of the invention, the component includes the at least one antenna switch and the at least one antenna switch is one of a GaAs switch, a CMOS switch, and a PIN diode switch.

In accordance with yet another feature of the invention, the metallization planes include at least one inside metallization plane and at least a portion of the passive components is embodied as one of conductor track sections in the at least one inside metallization plane and conductor track sections hidden on an inside of the carrier substrate and layer regions of the dielectric layer located therebetween.

With the objects of the invention in view, there is also provided a transmitter module for a high-frequency stage of a wireless communication system having an input impedance $Z_i$ and an output impedance $Z_o$, the system having a signal path embodied as transmission path having an input side and an output side, the signal path being disposed between a signal input and a signal output to be connected with an antenna, the transmitter module including a carrier substrate having a top surface, metallization planes, dielectric layers between the metallization planes, and through contacts connecting ones of the metallization planes, a power amplifier being disposed on the top surface of the carrier substrate, being disposed in the signal path on the input side and having an output impedance $Z_{PA}<Z_i$, a first impedance converter disposed in the signal path at the output side, said first impedance converter being embodied as a low-pass filter and having an input impedance $Z_{FICi}$ and an output impedance $Z_{FICo}$, said output impedance $Z_{PA}$ of said power amplifier being $Z_{PA}<Z_{FICi}<Z_o$ and the input impedance $Z_{FICi}$ of the first impedance converter being $Z_{FICi}<Z_{FICo}\leqq Z_o$, a second impedance converter carrying out an impedance transformation from $Z_{PA}$ to $Z_{FICi}$, and at least one of the two impedance converters having passive components at least partially embodied as structured conductor tracks in at least one of the metallization planes.

In accordance with yet a further feature of the invention, a portion of the passive components is embodied by conductor areas or conductor track sections and layer regions of the dielectric layers located therebetween.

In accordance with yet an added feature of the invention, a portion of the passive components is one of conductor areas, conductor track sections, layer regions of the dielectric layers between the conductor areas, and layer regions of the dielectric layers between the conductor track sections.

In accordance with a concomitant feature of the invention, the second impedance converter is disposed in the signal path between the power amplifier and the first impedance converter.

Other features that are considered as characteristic for the invention are set forth in the appended claims.

Although the invention is illustrated and described herein as embodied in a low-loss transmitter module, it is, nevertheless, not intended to be limited to the details shown because various modifications and structural changes may be made therein without departing from the spirit of the invention and within the scope and range of equivalents of the claims.

The construction and method of operation of the invention, however, together with additional objects and advantages thereof, will be best understood from the following description of specific embodiments when read in connection with the accompanying drawings.

DESCRIPTION OF THE PREFERRED EMBODIMENTS

Figure 1:
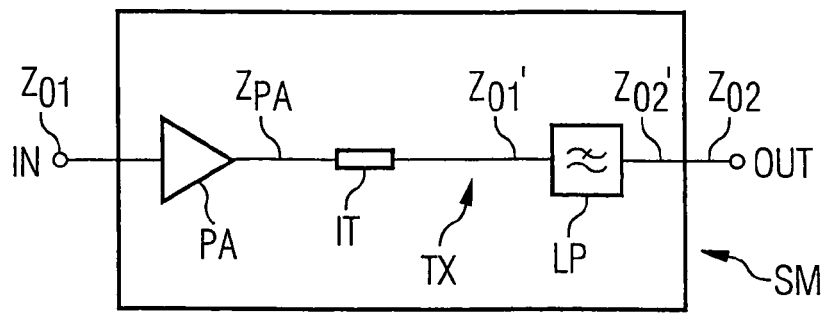
FIG. 1 is a block circuit diagram of a transmitter module according to the invention with a transmission path.

Referring now to the figures of the drawings in detail and first, particularly to FIG. 1 thereof, there is shown a first exemplary embodiment of a transmitter module SM according to the invention. The transmitter module has a signal path TX (transmission path) disposed between a signal input IN and a signal output OUT. The input impedance of the transmitter module is $Z_{01}$. The output impedance of the transmitter module is $Z_{02}$. A power amplifier PA is disposed at the input side. Generally, the output impedance $Z_{PA}$ of the power amplifier PA is much smaller than its input impedance, which, in this exemplary embodiment, equals the input impedance of the transmitter module $Z_{01}$. A low-pass filter LP is disposed at the output side in the transmission path. In this exemplary embodiment, the output impedance $Z'_{02}$ of the low-pass filter equals the output impedance $Z_{02}$ of the transmitter module. An impedance converter IT, which carries out an impedance transformation from $Z_{PA}$ to $Z'_{01}$, is disposed between the output of the power amplifier PA and the input of the low-pass filter LP. Preferably, the impedance converter IT is embodied as a line section of suitable length. It is also possible to embody the impedance converter IT by one or a plurality of LC members. At a chosen transmitter frequency, the impedance converter carries out a phase rotation of the signal of, preferably, 180°.

The adaptation of the impedance between the output of the power amplifier PA and the output of the transmitter module takes place in stages, initially from the value $Z_{PA}$ to the intermediate value $Z'_{01}$ through the impedance converter and, subsequently, from the intermediate value $Z'_{01}$ to the value $Z'_{02}$, or $Z_{02}$, respectively, through the low-pass filter LP.

Figure 2A:
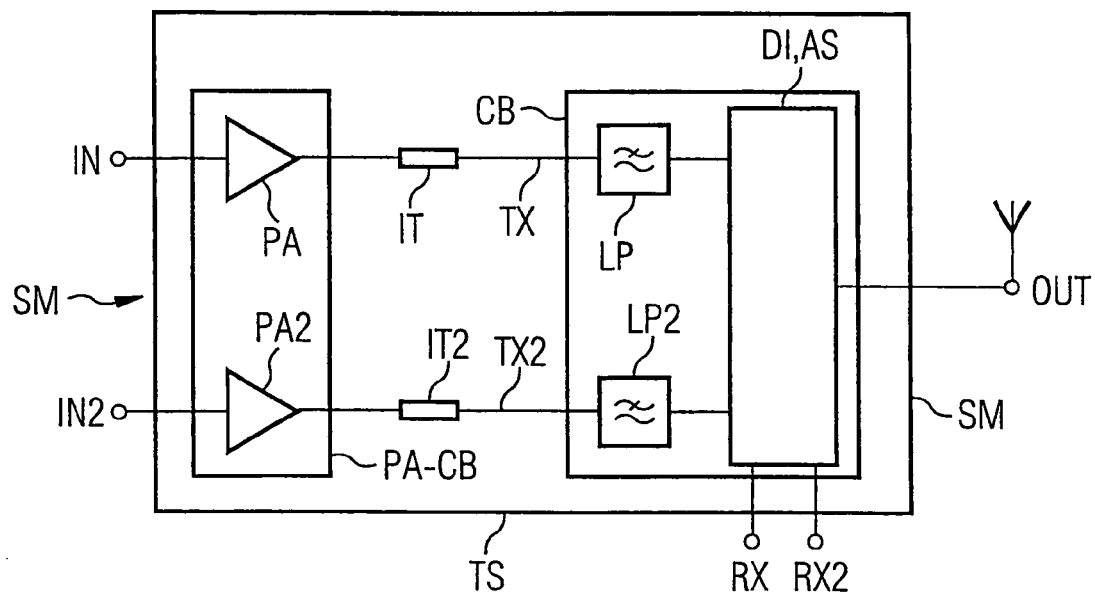
FIG. 2A is a block circuit diagram of a further transmitter module according to the invention with two transmission paths.
Figure 2B:
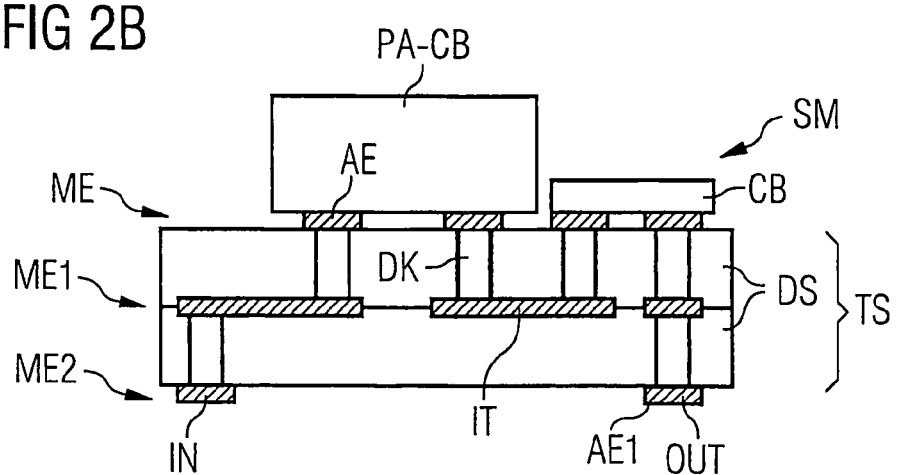
FIG. 2B is a diagrammatic cross-sectional view of a transmitter module according to the invention.

FIG. 2B illustrates a schematic cross-section of the fundamental configuration of the module according to the present invention. The components of the transmitter module are partly embodied as chip components CB, PA-CB and partly integrated in a carrier substrate TS in the metallization planes ME, ME1, ME2. The metallization planes ME, ME1, ME2 are connected with each other by chip components CB, PA-CB disposed on the top side of the carrier substrate TS and by through-contacts DK or electrical terminals AE, AE1, disposed on the printed circuit of the mobile radio. The carrier substrate TS includes dielectric layers DS disposed between the metallization planes ME, ME1, and ME2. Preferably, the dielectric layers DS are made of ceramic. The chip components CB, PA-CB are connected with the carrier substrate TS by the electrical terminals AE, for example by a Surface Mounted Device (SMD) or another connection technology, such as wire-bonding or flip-chip technology. The power amplifier PA is disposed in the chip component PA-CB. Preferably, the element PA-CB is a semiconductor chip. In this exemplary embodiment, the impedance converter IT is realized in a middle metallization plane ME1, which is disposed between two dielectric layers DS. It is also possible to partly or completely realize the impedance converter IT on the top side or bottom side of the carrier substrate. The elements of the impedance converter IT can also be embodied in a plurality of metallization planes ME, ME1, ME2. The elements of the low-pass filter LP can also be realized in one or a plurality of metallization planes of the carrier substrate TS. Alternatively, the impedance converter IT and/or the low-pass filter LP can, at least partly, be embodied in the chip component CB. In a further embodiment of the present invention, non-linear and/or active elements of an antenna switch can also be disposed in the chip component CB.

FIG. 2A is a block and schematic circuit diagram of a further transmitter module SM according to the invention with two transmission paths TX and TX2. The two transmission paths are embodied substantially in the same manner as in the embodiment of FIG. 1. In the exemplary embodiment of FIG. 2A, the power amplifier PA of the first transmission path TX and the power amplifier PA2 of the second transmission path TX2 are realized together in a discrete component, or chip component. The two transmission paths TX, TX2 are brought together at the output side by a diagrammatically illustrated diplexer DI, as is shown, for example, in FIG. 3. In FIG. 2a, the diplexer DI is realized with an antenna switch AS described in FIG. 3 in a functional block that is embodied, preferably, as a discrete component and is connected to an antenna at the output side. Depending on the operating mode, the antenna switch AS switches between the first and the second mobile radio standard, whereby the first mobile radio standard uses the transmission path TX and the receiving path RX2, and the second mobile radio standard uses the transmission path TX2 and the receiving path RX2 for the signal transmission. Preferably, the frequency bands of the two mobile radio standards are separated from each other by approximately one octave. The mode of operation of the elements IT2, LP2 disposed in the second transmission path TX2 corresponds to the elements IT, LP of the first transmission path TX.

In this exemplary embodiment, the diplexer DI, the antenna switch AS, and the low-pass filter LP and LP2 are realized in a modular chip component.

Figure 3:
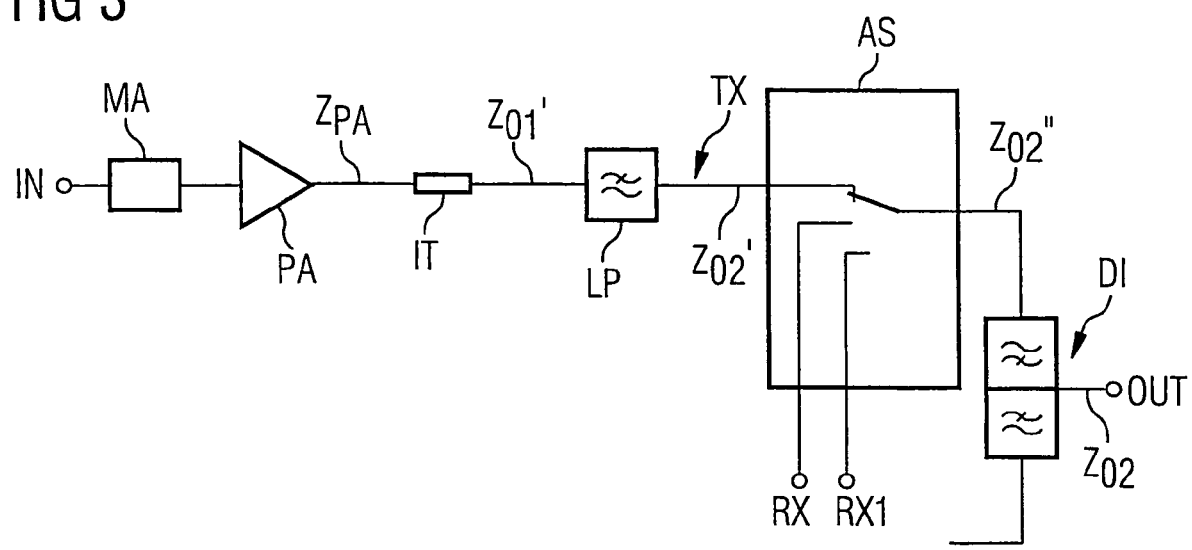
FIG. 3 is a block and schematic circuit diagram of sections of a transmitter module according to the invention with an adaptation network connected between a signal input and a power amplifier.

FIG. 3 illustrates sections of a further variant of the transmitter module according to the invention, which module is suitable for signal transmission in multi-band operation. A diplexer DI separates the signals of the frequency bands that differ from each other by one octave, for example. FIG. 3 illustrates a transmission path for a frequency band, for example, GSM 1800.

The diplexer DI has a low-pass filter and a high-pass filter. Signals of the mobile radio standard GSM 850 and/or GSM 900, for example, are transmitted through the low-pass filter of the diplexer. At least two frequency bands, preferably located next to each other, for example, GSM 1800 and GSM 1900, are transmitted through the high-pass filter of the diplexer DI. The receiving signals of the first mobile radio system (GSM 1800) are further processed in the receiving path RX. The receiving signals of the second mobile radio system (GSM 1900) are further processed in the receiving path RX1. The transmission signals of these two mobile radio systems are transmitted through the transmission path TX. The antenna switch AS switches between the transmission path TX and the respective receiving path RX, or RX1, depending on the switch position.

In this variant of the invention, an adaptation network MA is disposed between the signal input IN of the transmitter module and the input of the power amplifier PA.

In this exemplary embodiment, the impedance transformation (or impedance adaptation) from $Z_{PA}$ to $Z_{02}$ takes place in four stages—partly through the impedance converter IT from $Z_{PA}$ to $Z'_{01}$, through the low-pass filter LP from $Z'_{01}$ to $Z'_{02}$, through the antenna switch AS from the value $Z'_{02}$ to the value $Z''_{02}$, and through the diplexer DI from the value $Z''_{02}$ to the value $Z_{02}$. The second antenna switch connected to the low-pass filter of the diplexer DI is not illustrated in FIG. 3.

Figure 4A:
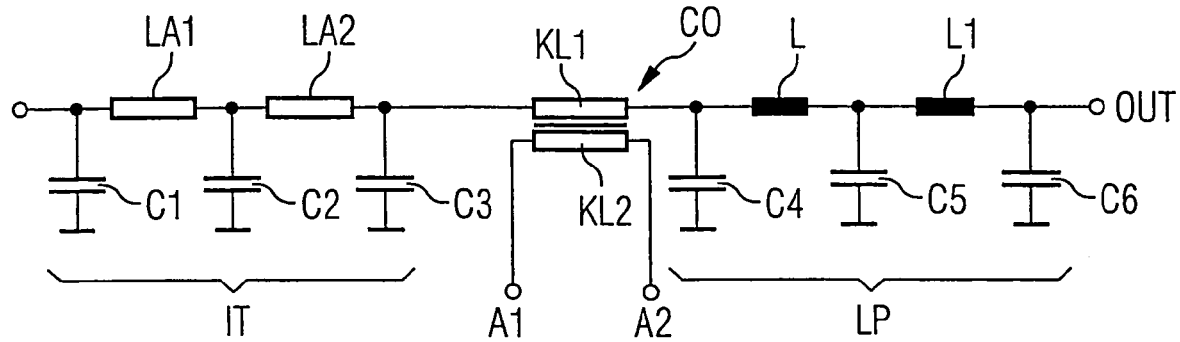
FIG. 4A is a schematic circuit diagram of a coupler configuration with capacitive coupling between an impedance converter and a low-pass filter.

FIG. 4A illustrates the configuration of a coupler CO between the impedance converter IT and the low-pass filter LP. The coupler CO is realized by a first coupling line KL1 disposed in the signal path and a second coupling line KL2 capacitively coupled with the first coupling line. The second coupling line KL2 is disposed between the electrical terminals A1 and A2. The terminals A1 and A2 can, for example, be further connected with a signal processor of a chip set. The coupler CO serves as power control of the power amplifier PA not illustrated in FIG. 4A. The impedance converter IT has line sections LA1 and LA2 disposed in the signal path, as well as capacitances C1, C2, and C3 disposed in parallel branches. The line sections LA1, LA2 and the capacitances C1, C2, and C3 form two π-members. The low-pass filter LP has inductors L and L1 disposed in the signal path and of capacitances C4, C5, and C6, disposed in parallel branches. The inductors L, L1, and the capacitances C4, C5, and C6 form two π-members or a low-pass filter to the second order, respectively. The number of π-members in the impedance converter IT or low-pass filter LP can also be 1 (preferred variant) or >2.

Figure 4B:
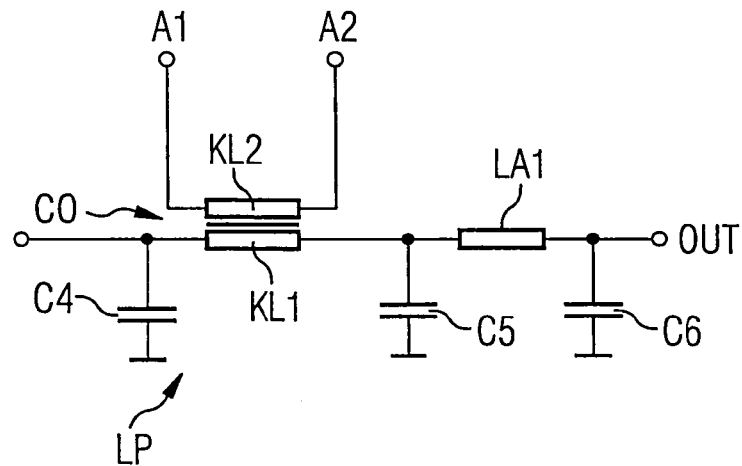
FIG. 4B is a schematic circuit diagram of a coupler configuration in the low-pass filter.

FIG. 4B illustrates that the coupler CO can be disposed partly in the low-pass filter LP. In this exemplary embodiment, the low-pass filter LP has the following elements: the line section LA1 and a first coupling line KL1, which are disposed in the signal path, as well as capacitances C4, C5, and C6, which are disposed in parallel branches. In this exemplary embodiment, the second coupling line KL2, coupled with the first coupling line, is shorter than the first coupling line. It is also possible that two lines of same or different lengths only partly overlap each other. The coupling factor can be adjusted by the overlapping area of the two coupling lines KL1.

Figure 4C:
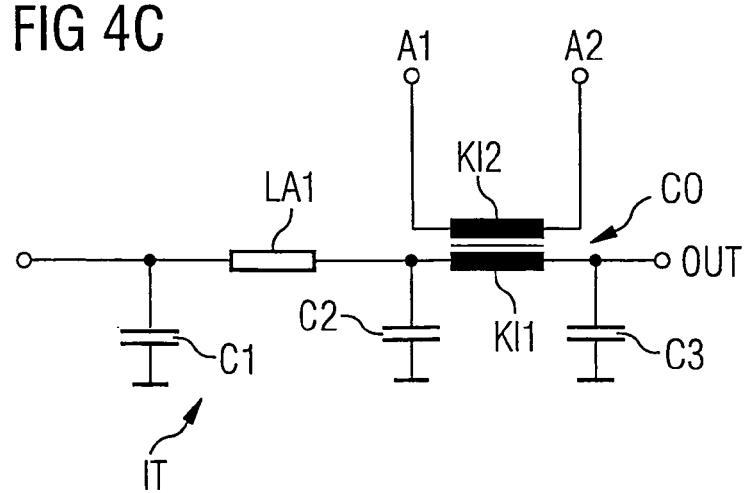
FIG. 4C is a schematic circuit diagram of a coupler configuration in the impedance converter.

FIG. 4C illustrates a further possible configuration of the coupler CO. The coupler CO is partly disposed in the impedance converter IT. The impedance converter IT has differently embodied stages. The capacitances C1, C2, and C3 are disposed in the parallel branches. Line sections LA1 connected in series in the signal path and a first coupling inductor KI1 are connected in the signal path. The coupler CO is formed by the first coupling inductor KI1 and a coupling inductor KI2.

Figure 5:
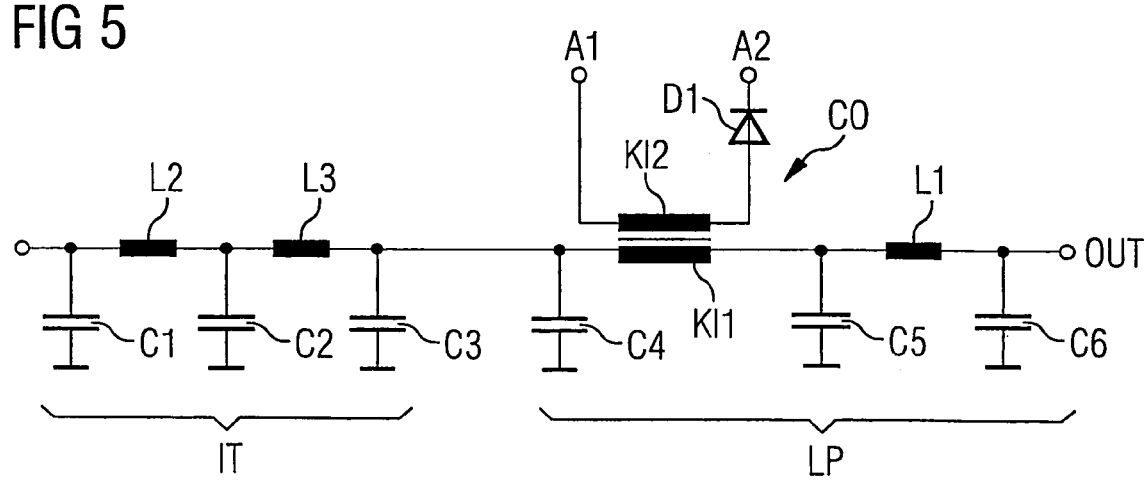
FIG. 5 is a schematic circuit diagram of a coupler configuration with transformer coupling in the low-pass filter.

FIG. 5 shows a coupler CO disposed in the low-pass filter LP with a transformer coupling of the coupling inductor KI1 and KI2, whereby a diode D1 is connected in series with the second coupling inductor KI2. In this exemplary embodiment, the diode D1 is embodied as a discrete component and is disposed on the top side of the carrier substrate TS, not illustrated in FIG. 5.

In this exemplary embodiment, the impedance converter IT is formed by inductors L2 and L3, disposed in the signal path, as well as by capacitances C1, C2, and C3.

The width of the strip lines, which realize the impedance converter IT or the coupling lines KL1, KL2, depends on the relative dielectric constant $\epsilon_{rel}$ of the corresponding dielectric layer (which is located between the strip line and the ground area). At low values of $\epsilon_{rel}$, i.e., when $\epsilon_{rel}<12$, the line width must be chosen comparatively large to realize the predetermined line impedance, whereby, due to the large line width, the wave mode (quasi TEM wave) in the strip line can be influenced. In the preferred variant of the invention, the dielectric layers, which are directly in contact with the strip lines, have a relative dielectric constant of $\epsilon_{rel}>12$ (highly permeable dielectric layers). Fundamentally, any component structures (for example, the capacitances C1 to C6) with small measurements can be realized in the environment of the highly permeable dielectric layers disposed in two metallization planes on top of each other, capacitively coupled by the corresponding layer DS.

Contrary thereto, the inductors (L, L1 to L3) or the elements with transformer couplings (KI1, KI2) can best be realized in the environment of dielectric layers with a lower relative dielectric constant $\epsilon_{rel}<12$.

Dielectric layers DS with different dielectric characteristics can, thus, be provided in the configuration of the module according to the invention. Preferably, the highly permeable dielectric layers form the upper layers of the module according to the invention. However, it is also possible that the highly permeable dielectric layers are disposed in the lower region of the module. It is also possible to configure the dielectric layers with different $\epsilon_{rel}$ on top of each other in random sequence.

Figure 6:
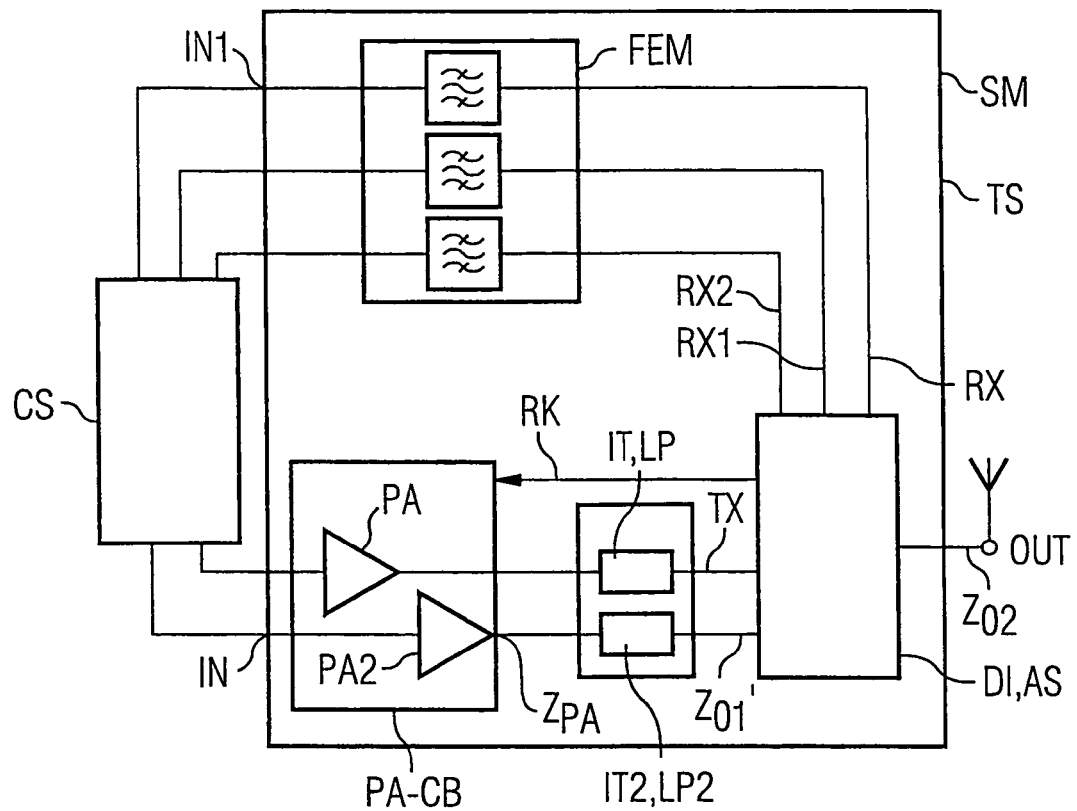
FIG. 6 is a block and schematic circuit diagram of a further transmitter module according to the invention with three reception paths and a front end partial module.

FIG. 6 introduces a further variant of the transmitter module SM according to the invention, which is connected with a chip set CS of the end device. The transmitter module SM is configured for multi-band operation (for example, for mobile radio standards GSM900, GSM1800, GSM1900) and, in addition to the above-mentioned components (PA-CB, IT, LP, DI, AS) connected in the transmission path TX (GSM900) or TX2 (GSM1800/1900), also includes three receiving paths RX (GSM900), RX1 (GSM1800), and RX2 (GSM1900). A band-pass filter is disposed in the respective receiving path, whereby all of the band-pass filters are realized, preferably, in a chip component, which forms a front end partial module FEM. Preferably, the front end partial module FEM is disposed on the top side of the carrier substrate TS of the transmitter module SM and is electrically as well as mechanically solidly connected with the carrier substrate TS. The front end partial module FEM is electrically connected through the input IN1 of the transmitter module with the corresponding low-noise amplifiers (LNA, Low Noise Amplifier) which are disposed in the chip set CS.

Use of a front end partial module in a transmitter module according to the invention has the advantage that the length of the feed lines between the circuit components on the receiving side (compared with a separately embodied front end module) is shortened and can be controlled better. The thermal decoupling of the front end partial module, in particular, from the power amplifier partial module, is achieved by heat sinks or by a suitable shaping during the formation of the carrier substrate TS. The electrical decoupling of the two partial modules is possible by common deflection elements.

As indicated in the figure by a rectangle, the impedance converters IT, IT2, and the low-pass filters LP, LP2 are realized in a chip component, or, alternatively, in the carrier substrate TS. As indicated, the passive frequency switch DI and the antenna switch AS can be realized in a chip component. The passive frequency switch DI can also be integrated, at least partly, in the carrier substrate TS. The antenna switch AS is feedback-coupled with the semiconductor chip PA-CB (power amplifier partial module) through the path RK (power control).

It is also possible to realize the components introduced herein in the transmitter path in a chip component or to combine them with each other at random. For example, it is possible to realize the power amplifiers PA, PA2 and the antenna switch AS in a common chip component.

Figure 7:
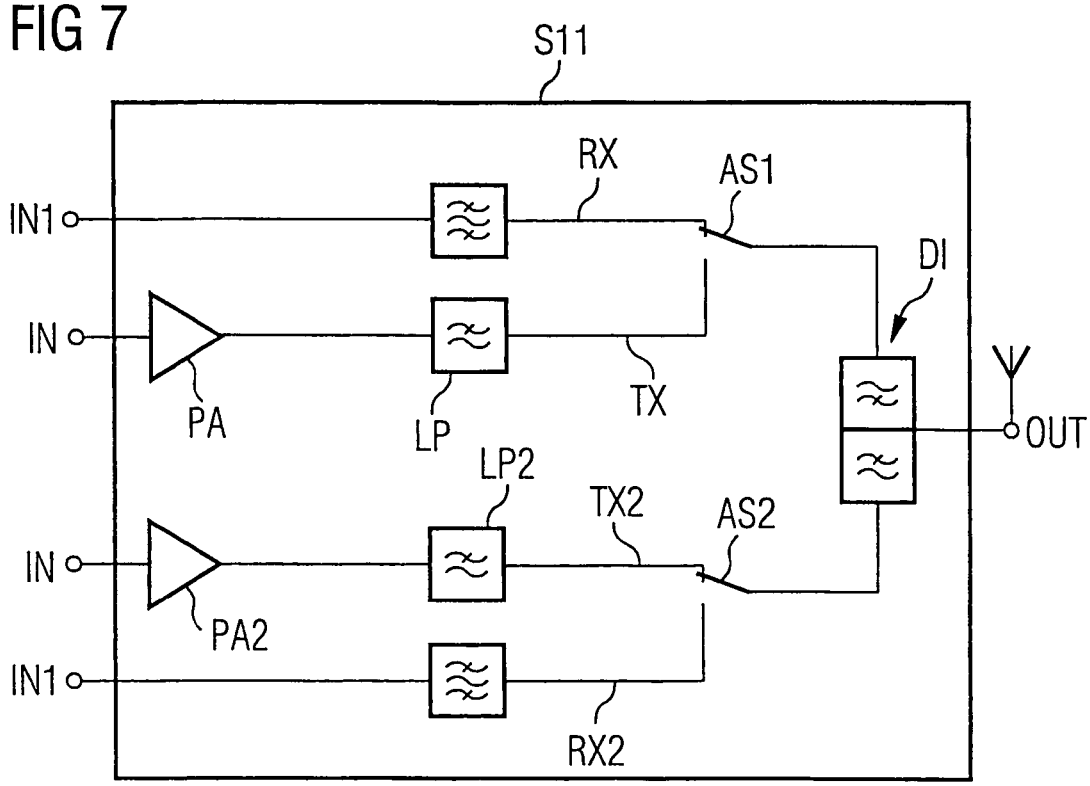
FIG. 7 is a block and schematic circuit diagram of a further transmitter module according to the invention with two antenna switches.

FIG. 7 illustrates a block diagram of a further transmitter module according to the invention, which has a diplexer DI (passive frequency switch) integrated in the carrier substrate at the antenna side. The diplexer separates the signals of the mobile radio standard, which differ by approximately one octave (for example, GSM850/GSM900, and GSM1800/GSM1900). The transmission or receiving path TX or RX, respectively, (or TX2 or RX2) is electrically connected with the input of the diplexer DI in different time slots through antenna switches AS1 (or AS2).

The antenna switches AS, AS1, and AS3 can each be CMOS-switches, a GaAs-switch, or a switch based upon PIN diodes, which are embodied as bare-die, or Surface Mounted Device (SMD) chip components.

The first and/or the second transmission path can each be associated with at least two different mobile radio standards (for example GSM850/GSM900, or GSM1800/GSM1900/UMTS).

In addition to the implementations presented in the exemplary embodiments and the corresponding figures, the invention includes a series of further combination, which can be obtained by leaving off individual components or by combining individual components of the described exemplary embodiments. Also, the invention is not limited to a certain frequency range.

We claim:

1. A transmitter module for a high-frequency stage of a wireless communication system having an input impedance $Z_i$ and an output impedance $Z_o$, the system having a signal path embodied as transmission path with an input side and an output side, the signal path being disposed between a signal input and a signal output to be connected to an antenna, the transmitter module comprising:
   a carrier substrate having a top surface, metallization planes, dielectric layers between said metallization planes, and through contacts connecting ones of said metallization planes;
   a power amplifier being disposed on said top surface of said carrier substrate and in the signal path on the input side thereof, said power amplifier having an output impedance $Z_{PA} < Z_i$;
   a low-pass filter disposed in the signal path at the output side, said low-pass filter having an input impedance $Z_{LPi}$ and an output impedance $Z_{LPo}$, said output impedance $Z_{PA}$ of said power amplifier being $Z_{PA} < Z_{LPi} < Z_o$ and said input impedance $Z_{LPi}$ of said low-pass filter being $Z_{LPi} < Z_{LPo} \leq Z_o$;
   an impedance converter carrying out an impedance transformation from $Z_{PA}$ to $Z_{LPi}$ and being disposed in the signal path between said power amplifier and said low-pass filter; and
   at least one of said impedance converter and said low-pass filter having passive components at least partially embodied as at least one of:
      conductor track sections in at least one of said metallization planes; and
      conductor track sections and layer regions of said dielectric layer disposed between said conductor track sections.

2. The transmitter module according to claim 1, further comprising a component selected from at least one of a passive frequency switch and at least one antenna switch, said component being disposed in the signal path between said low-pass filter and the signal output.

3. The transmitter module according to claim 2, wherein:
   said component includes said antenna switch and said passive frequency switch; and
   said antenna switch is connected between said low-pass filter and said passive frequency switch.

4. The transmitter module according to claim 2, wherein:
   said component includes said at least one antenna switch; and
   said at least one antenna switch is one of a GaAs switch, a CMOS switch, and a PIN diode switch.

5. The transmitter module according to claim 2, wherein:
   said component includes said passive frequency switch; and
   said passive frequency switch is one of a diplexer and a duplexer.

6. The transmitter module according to claim 2, further comprising:
   a second signal input;
   at least one further signal path being embodied as a transmission path, the further signal path being connected with said second signal input; and
   the further signal path having substantially the same components as the first signal path and being connected with the signal output through one of:
      said antenna switch;
      a further antenna switch;
      said passive frequency switch; and
      a further passive frequency switch.

7. The transmitter module according to claim 6, wherein the first and the second transmission paths are associated with different frequency bands of different wireless communication systems.

8. The transmitter module according to claim 6, wherein at least one of the first and second transmission paths are each associated with at least two different frequency bands of wireless communication systems.

9. The transmitter module according to claim 1, further comprising an adaptation network connected in the signal path between the signal input and said power amplifier.

10. The transmitter module according to claim 9, wherein said adaptation network is disposed in at least one of said metallization planes.

11. The transmitter module according to claim 1, further comprising a coupler galvanically separated from the signal path in the module, at least part of said coupler monitoring transmission power in the signal path.

12. The transmitter module according to claim 11, wherein:
   said coupler has first and second coupling inductors;
   a first of said coupling inductors is disposed in the signal path downstream of said power amplifier; and
   said first and second coupling inductors:
      are coupled through a transformer coupling; and are one of:
         next to one another in the same one of said metallization planes; and
         on top of one another in at least two adjacent ones of said metallization planes.

13. The transmitter module according to claim 12, wherein said first coupling inductor is disposed in one of said low-pass filter and said impedance converter.

14. The transmitter module according to claim 11, wherein said coupler has:
   a first coupling line having a given length and being disposed in the signal path downstream of said power amplifier with respect to a direction from the input side to the output side;

a second coupling line having a length no greater than said given length;
said first and second coupling lines being coupled through a capacitive coupling; and
said first and second coupling lines being one of:
disposed next to one another in the same one of said metallization planes; and
disposed on top of one another in at least two adjacent ones of said metallization planes.

15. The transmitter module according to claim 14, wherein said first coupling line is disposed in one of said low-pass filter and said impedance converter.

16. The transmitter module according to claim 15, wherein said first coupling line is a λ/4 line.

17. The transmitter module according to claim 14, wherein said first coupling line is a λ/4 line.

18. The transmitter module according to claim 11, wherein said coupling is disposed one of upstream of and downstream from said low-pass filter.

19. The transmitter module according to claim 1, wherein at least one of said impedance converter and said low-pass filter has at least one stage, said at least one stage being one of:
a power transformation;
a low pass filter member;
a line section and a capacitor connected in parallel thereto against ground; and
a combination of LC elements.

20. The transmitter module according to claim 1, wherein said impedance converter carries out a 180-degree phase rotation of the signal at a given transmission frequency.

21. The transmitter module according to claim 1, wherein said dielectric layers are of ceramic.

22. The transmitter module according to claim 1, wherein said carrier substrate has a mixed composition of ceramic and laminate.

23. The transmitter module according to claim 1, wherein at least one of said dielectric layers has a dielectric constant>12.

24. The transmitter module according to claim 21, wherein at least one of said dielectric layers has a dielectric constant>12.

25. The transmitter module according to claim 1, further comprising:
at least one receiving path;
a front end partial module disposed in said at least one receiving path; and
said front end partial module is associated with said carrier substrate.

26. The transmitter module according to claim 25, wherein:
said carrier substrate has a surface; and
said front end partial module is disposed on said surface of said carrier substrate.

27. The transmitter module according to claim 25, wherein said front end partial module has at least one band-pass filter operating with acoustic waves.

28. The transmitter module according to claim 1, wherein:
said metallization planes include at least one inside metallization plane; and
at least a portion of said passive components is embodied as one of:
conductor track sections in said at least one inside metallization plane; and
conductor track sections hidden on an inside of said carrier substrate and layer regions of said dielectric layer located therebetween.

29. The transmitter module according to claim 1, wherein one of said passive components of said low-pass filter is an inductor or a capacitor.

30. The transmitter module according to claim 1, wherein one of said passive components of said low-pass filter is a capacitor.

31. A transmitter module for a high-frequency stage of a wireless communication system having an input impedance $Z_i$ and an output impedance $Z_o$, the system having a signal path embodied as transmission path with an input side and an output side, the signal path being disposed between a signal input and a signal output to be connected with an antenna, the transmitter module comprising:
a carrier substrate having a top surface, metallization planes, dielectric layers between said metallization planes, and through contacts connecting ones of said metallization planes;
a power amplifier:
being disposed on said top surface of said carrier substrate;
being disposed in the signal path on the input side; and
having an output impedance $Z_{PA}<Z_i$;
a first impedance converter disposed in the signal path at the output side, said first impedance converter being embodied as a low-pass filter and having an input impedance $Z_{FICi}$ and an output impedance $Z_{FICo}$, said output impedance $Z_{PA}$ of said power amplifier being $Z_{PA}<Z_{FICi}<Z_o$ and said input impedance $Z_{FICi}$ of said first impedance converter being $Z_{FICi}<Z_{FICo}\leq Z_o$;
a second impedance converter carrying out an impedance transformation from $Z_{PA}$ to $Z_{FICi}$; and
at least one of said two impedance converters having passive components at least partially embodied as structured conductor tracks in at least one of said metallization planes.

32. The transmitter module according to claim 31, wherein a portion of said passive components is embodied by conductor areas or conductor track sections and layer regions of said dielectric layers located therebetween.

33. The transmitter module according to claim 31, wherein a portion of said passive components is one of conductor areas and conductor track sections, whereby layer regions of said dielectric layers are disposed between said conductor areas or between said conductor track sections.

34. The transmitter module according to claim 31, wherein said second impedance converter is disposed in the signal path between said power amplifier and said first impedance converter.

* * * * *